(12) United States Patent
Park et al.

(10) Patent No.: US 11,362,068 B2
(45) Date of Patent: Jun. 14, 2022

(54) SEMICONDUCTOR PACKAGE INCLUDING A FILLET LAYER

(71) Applicant: SAMSUNG ELECTRONICS CO., LTD., Suwon-si (KR)

(72) Inventors: Sang-Sick Park, Hwaseong-si (KR); Min Soo Kim, Gumi-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/877,211

(22) Filed: May 18, 2020

(65) Prior Publication Data

US 2021/0111159 A1    Apr. 15, 2021

(30) Foreign Application Priority Data

Oct. 11, 2019 (KR) .................. 10-2019-0125852

(51) Int. Cl.
    *H01L 25/065* (2006.01)
(52) U.S. Cl.
    CPC ...... *H01L 25/0657* (2013.01); *H01L 2225/06513* (2013.01); *H01L 2225/06517* (2013.01); *H01L 2225/06541* (2013.01); *H01L 2225/06582* (2013.01)
(58) Field of Classification Search
    None
    See application file for complete search history.

(56) References Cited

U.S. PATENT DOCUMENTS

| 6,519,844 | B1 | 2/2003 | Nagarajan et al. |
| 6,600,217 | B2 | 7/2003 | Onodera et al. |
| 6,614,122 | B1 | 9/2003 | Dory et al. |
| 7,564,140 | B2 * | 7/2009 | Lee ............ H01L 21/563 257/778 |
| 8,228,682 | B1 * | 7/2012 | Zohni ............ H01G 2/065 361/782 |
| 8,536,718 | B2 | 9/2013 | Ko et al. |
| 8,580,873 | B2 | 11/2013 | Dausensfeak et al. |
| 8,982,577 | B1 | 3/2015 | Fuents |
| 9,263,332 | B2 | 2/2016 | Chi et al. |
| 2013/0299995 | A1 | 11/2013 | Lee et al. |
| 2015/0001733 | A1 * | 1/2015 | Karhade ......... H01L 23/49894 257/774 |
| 2017/0182544 | A1 | 6/2017 | Kwan et al. |
| 2017/0358558 | A1 * | 12/2017 | Lee ............ H01L 25/0657 |

FOREIGN PATENT DOCUMENTS

| JP | JP5186741 | 2/2008 |
| KR | 20090080605 | 7/2009 |

* cited by examiner

*Primary Examiner* — Robert K Carpenter
(74) *Attorney, Agent, or Firm* — F. Chau & Associates, LLC

(57) ABSTRACT

A semiconductor package includes a base substrate having a first semiconductor substrate, and a first protective layer covering a top side thereof. A first semiconductor chip is on the first protective layer. A first fillet layer fills a space between the first protective layer and the first semiconductor chip. A first side surface of the base substrate extends in a first direction, and second and third side surfaces extend in a second direction. The base substrate includes two corner regions and a side region between the corner regions. A first protective layer in the side region includes a first side trench which overlaps the first semiconductor chip. A part of the first fillet layer fills the first side trench.

20 Claims, 13 Drawing Sheets

SEMICONDUCTOR PACKAGE INCLUDING A FILLET LAYER

CROSS-REFERENCE TO RELATED APPLICATION

This application claims priority to Korean Patent Application No. 10-2019-0125852, filed on Oct. 11, 2019, in the Korean Intellectual Property Office the disclosure of which is herein incorporated by reference in its entirety.

TECHNICAL FIELD

The present disclosure relates to a semiconductor package and, more specifically, to a semiconductor package including a fillet layer.

DISCUSSION OF THE RELATED ART

As electronic devices are reduced in size and weight and their functions are diversified, the semiconductor packages used for electrical devices are also being made smaller, lighter, and multifunctional. This can be accomplished by placing a plurality of semiconductor chips within a single package, for example, in a stacked structure.

However, where there are many semiconductor chips within a single package, there can be problems such as frequent defects due to cracks or the like and degradation of reliability of the product.

SUMMARY

A semiconductor package includes a base substrate with a first semiconductor substrate. A first protective layer at least partially covers a top side of the first semiconductor substrate. A first semiconductor chip is disposed on the first protective layer and a first fillet layer. The first fillet layer fills a space between the first protective layer and the first semiconductor chip. The base substrate includes a first side surface extending in a first direction, and a second side surface and a third side surface each extending from both ends of the first side surface in a second direction intersecting the first direction. The base substrate includes a first corner region including a first corner formed by the first side surface and the second side surface. A second corner region is formed by the first side surface and the third side surface. A side region is disposed between the first corner region and the second corner region. The first protective layer in the side region includes a first side trench which overlaps the first semiconductor chip. A part of the first fillet layer fills the first side trench.

A semiconductor package includes a base substrate having a semiconductor substrate. A protective layer at least partially covers a top side of the semiconductor substrate. A semiconductor chip is disposed on the protective layer and a fillet layer. The fillet layer fills a space between the protective layer and the semiconductor chip. The base substrate includes a first side surface extending in a first direction, and a second side surface extending from one end of the first side surface in a second direction intersecting the first direction. The base substrate includes a first corner region including a corner formed by the first side surface and the second side surface, and a first side region spaced apart from the corner and including a part of the first side surface. The protective layer in the first side region includes a first side trench which overlaps the semiconductor chip. The protective layer in the first corner region includes a corner trench which overlaps the semiconductor chip. A volume of the first side trench is greater than a volume of the corner trench. A part of the fillet layer fills the first side trench and the corner trench.

A semiconductor package includes a base substrate having a first semiconductor substrate. A first protective layer at least partially covers a top side of the first semiconductor substrate. A first penetration via penetrates the first semiconductor substrate and the first protective layer. A first semiconductor chip is disposed on the first protective layer. A first bump electrically connects the first penetration via and the first semiconductor chip. A first fillet layer at least partially surrounds the first bump, between the first protective layer and the first semiconductor chip. The base substrate includes a first side surface extending in a first direction, and a second side surface extending from one end of the first side surface in a second direction intersecting the first direction. The base substrate includes a corner region including a corner formed by the first side surface and the second side surface. A side region spaced apart from the corner includes a part of the first side surface. The first protective layer in the side region includes a first side trench which overlaps the first semiconductor chip. A part of the first fillet layer fills the first side trench.

However, the present inventive concept is not necessarily restricted to the exemplary embodiments thereof set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Hereinafter, a semiconductor package according to some exemplary embodiments of the present disclosure will be described with reference to FIGS. 1 to 3.

In this specification, although terms such as first and second are used to describe various elements or components, that these elements or components are not necessarily limited by these terms. These terms are used to merely distinguish a single element or component from other elements or components. Accordingly, a first element or component described below may be a second element or component within the present inventive concept.

Figure 1:
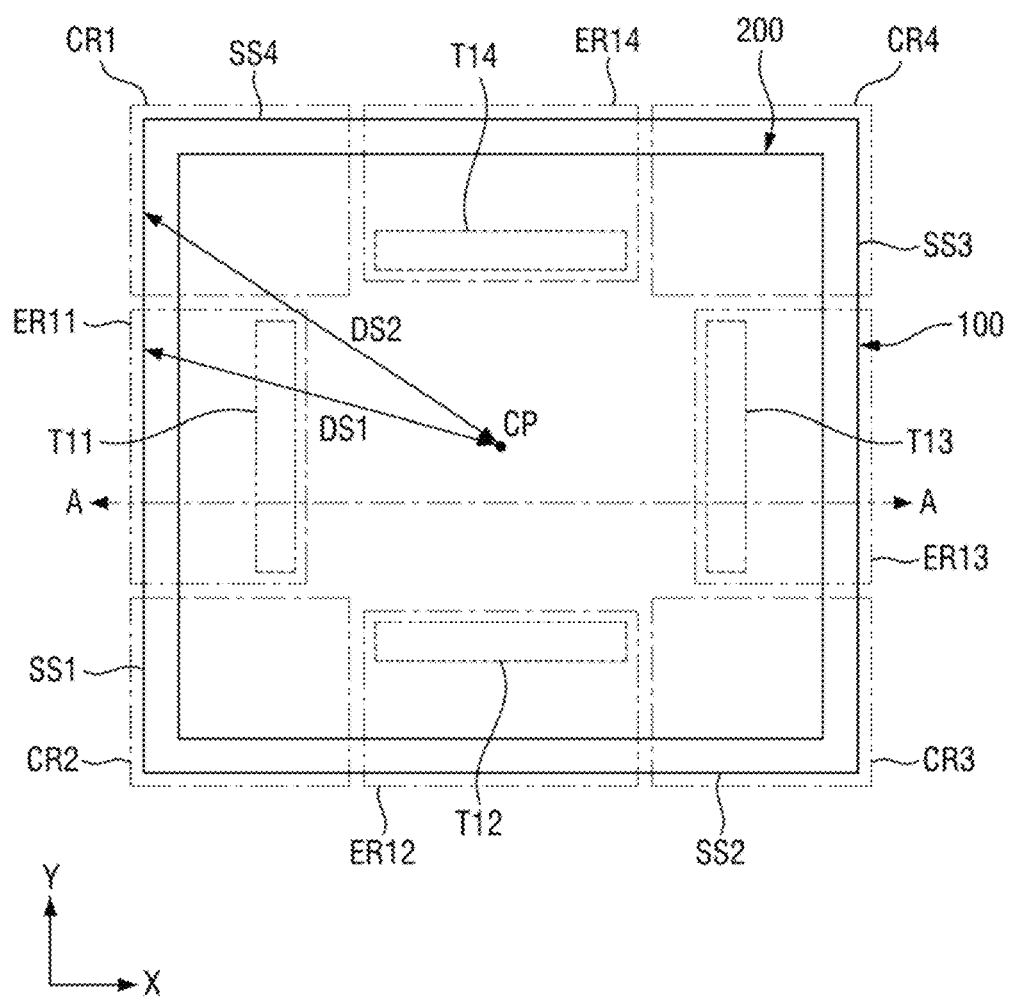
FIG. 1 is a layout diagram illustrating a semiconductor package according to some exemplary embodiments of the present disclosure.

FIG. 1 is a layout diagram illustrating a semiconductor package according to some exemplary embodiments of the present disclosure. FIG. 2 is a cross-sectional view taken along a line A-A of FIG. 1.

Figure 2:
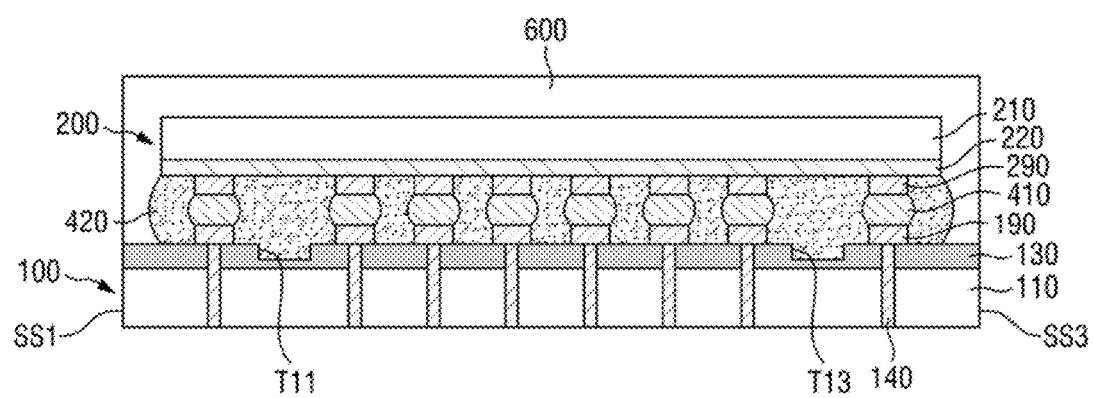
FIG. 2 is a cross-sectional view taken along a line A-A of FIG. 1.

Referring to FIGS. 1 and 2, the semiconductor package, according to some exemplary embodiments of the present disclosure, includes a base substrate 100, a first semiconductor chip 200, a first bump 410, a first fillet layer 420, and a molding member 600.

The base substrate 100 may be, for example, a printed circuit board (PCB), a ceramic substrate or an interposer. Alternatively, the base substrate 100 may be a semiconductor chip including a semiconductor element. The base substrate 100 may function as a support substrate for the semiconductor package. For example, a first semiconductor chip 200, as is described in greater detail below, may be stacked on the base substrate 100.

As shown in FIG. 1, the base substrate 100 may include a plurality of corner regions CR1 to CR4 and a plurality of side regions ER11 to ER14. Hereinafter, the base substrate 100 will be described as including only four corner regions CR1 to CR4 and four side regions ER11 to ER14. However, this is only an example, and the number of corner regions and the number of side regions may be different depending on the shape of the base substrate 100.

For example, the base substrate 100 may include first to fourth side surfaces SS1 to SS4. A first side surface SS1 may extend primarily in a first direction Y. A second side surface SS2 may extend from one end of the first side surface SS1 primarily in a second direction X intersecting the first direction Y. A third side surface SS3 extends from one end of the second side surface SS2 primarily in the first direction Y and may face the first side surface SS1. A fourth side surface SS4 extends primarily in the second direction X from the other end of the first side surface SS1 and may face the second side surface SS2. In some exemplary embodiments of the present disclosure, the first to fourth side surfaces SS1 to SS4 may generally form a rectangular shape.

The first corner region CR1 may include a first corner formed by the first side surface SS1 and the fourth side surface SS4. The second corner region CR2 may include a second corner formed by the first side surface SS1 and the second side surface SS2. The third corner region CR3 may include a third corner formed by the second side surface SS2 and the third side surface SS3. The fourth corner region CR4 may include a fourth corner formed by the third side surface SS3 and the fourth side surface SS4.

A first side region ER11 may be interposed between the first corner region CR1 and the second corner region CR2. The first side region ER11 may be spaced apart from the first corner of the first corner region CR1 and the second corner of the second corner region CR2. In some exemplary embodiments of the present disclosure, the first side region ER11 may include a part of the first side surface SS1.

A second side region ER12 may be interposed between the second corner region CR2 and the third corner region CR3. The second side region ER12 may be spaced apart from the second corner of the second corner region CR2 and the third corner of the third corner region CR3. In some exemplary embodiments of the present disclosure, the second side region ER12 may include a part of the second side surface SS2.

A third side region ER13 may be interposed between the third corner region CR3 and the fourth corner region CR4. The third side region ER13 may be spaced part from the third corner of the third corner region CR3 and the fourth corner of the fourth corner region CR4. In some exemplary embodiments of the present disclosure, the third side region ER13 may include a part of the third side surface SS3.

A fourth side region ER14 may be interposed between the first corner region CR1 and the fourth corner region CR4. The fourth side region ER14 may be spaced apart from the first corner of the first corner region CR1 and the fourth corner of the fourth corner region CR4. In some exemplary embodiments of the present disclosure, the fourth side region ER14 may include a part of the fourth side surface SS4.

In some exemplary embodiments of the present disclosure, a distance from a center CP of the base substrate 100 to the side surface of the base substrate 100 in the side regions ER11 to ER4 may be smaller than a distance from the center CP of the base substrate 100 to the side surface of the base substrate 100 in the corner regions CR1 to CR4. For example, a distance DS1 from the center CP of the base substrate 100 to the first side surface SS1 in the first side region ER11 may be smaller than a distance DS2 from the center CP of the base substrate 100 to the first side surface SS1 in the first corner region CR1.

As shown in FIG. 2, the base substrate 100 may include a first semiconductor substrate 110 and a first protective layer 130.

The first semiconductor substrate 110 may be, for example, bulk silicon or SOI (silicon-on-insulator). Alternatively, the first semiconductor substrate 110 may be a silicon substrate, or may include, but the present inventive concept is not necessarily limited to including, other materials such as silicon germanium, SGOI (silicon germanium on insulator), indium antimonide, lead tellurium compound, indium arsenide, indium phosphide, gallium arsenide and/or gallium antimonide.

The first protective layer 130 may at least partially cover the top side of the first semiconductor substrate 110. In some exemplary embodiments of the present disclosure, the first protective layer 130 may at least partially cover a back side of the first semiconductor substrate 110. For example, a semiconductor element may be formed on a front side of the first semiconductor substrate 110, and the first protective layer 130 may be formed on the back side of the first semiconductor substrate 110.

The first protective layer 130 may include a non-conductive film (NCF). For example, the first protective layer 130 may include, but the present inventive concept is not necessarily limited to including, an insulating polymer. The first protective layer 130 may be formed by, but the present inventive concept is not necessarily limited to, for example, a spin coating process or a spray process.

The first protective layer 130 may include side trenches T11 to T14. The side trenches T11 to T14 may be formed, for example, by etching a part of the first protective layer 130.

The side trenches T11 to T14 may be formed in the side regions ER11 to ER14. For example, as shown in FIG. 1, a first side trench T11 may be formed in the first side region ER11, a second side trench T12 may be formed in the second side region ER12, a third side trench T13 may be formed in the third side region ER13, and a fourth side trench T14 may be formed in the fourth side region ER14.

In some exemplary embodiments of the present disclosure, the side trenches T11 to T14 may at least partially overlap a first semiconductor chip 200 that is described in greater described below. Here, the term "overlap" means an overlap in a direction perpendicular to the top side of the base substrate 100. For example, from a planar viewpoint, the side trenches T11 to T14 may be at least partially covered by the first semiconductor chip 200.

Although the first to fourth side trenches T11 to T14 are shown to have the same size as each other, this is only offered as an example. For example, the first to fourth side trenches T11 to T14 may have lengths, widths, or depths that are different from each other. Therefore, the first to fourth side trenches T11 to T14 may have volumes different from each other.

In addition, although the first to fourth side trenches T11 to T14 are shown as being symmetric about the center CP of the base substrate 100, this is only offered as an example. For example, according to the process of forming the first fillet layer 420, the arrangement and shape of the first to fourth side trenches T11 to T14 may be various.

In some exemplary embodiments of the present disclosure, the first side trench T11 and the third side trench T13 may extend primarily in the first direction Y, and the second side trench T12 and the fourth side trench T14 may each extend primarily in the second direction X.

In some exemplary embodiments of the present disclosure, the depths of the side trenches T11 to T14 may be smaller than the thickness of the first protective layer 130. For example, as shown in FIG. 2, the depth of the first side trench T11 and the depth of the third side trench T13 may be smaller than the thickness of the first protective layer 130. For example, the height of the bottom side of the first side trench T11 and the height of the bottom side of the third side trench T13 may be higher than the height of the top side of the first semiconductor substrate 110.

In some exemplary embodiments of the present disclosure, the first protective layer 130 in the corner regions CR1 to CR4 might not include a trench. For example, the side trenches T11 to T14 might not extend to the corner regions CR1 to CR4.

In some exemplary embodiments of the present disclosure, the base substrate 100 may further include a plurality of first penetration vias 140 that penetrate the first semiconductor substrate 110. The first penetration via 140 may have a columnar shape.

In some exemplary embodiments of the present disclosure, the first penetration via 140 may penetrate the first semiconductor substrate 110 and the first protective layer 130. For example, the bottom side of the first penetration via 140 may be exposed from the bottom side of the first semiconductor substrate 110, and the top side of the first penetration via 140 may be exposed from the top side of the first protective layer 130.

In some exemplary embodiments of the present disclosure, the first penetration via 140 might not overlap the side trenches T11 to T14. For example, the top side of the first penetration via 140 might not be exposed from the side trenches T11 to T14.

In some exemplary embodiments of the present disclosure, the first penetration via 140 may include a barrier film formed on a columnar surface, and a buried conductive layer which fills the inside of the barrier film. The barrier film may include, but the present inventive concept is not necessarily limited to including, at least one of Ti, TiN, Ta, TaN, Ru, Co, Mn, WN, Ni, and NiB. The buried conductive layer may include, but the present inventive concept is not necessarily limited to including, at least one Cu alloys such as one of Cu, CuSn, CuMg, CuNi, CuZn, CuPd, CuAu, CuRe and CuW, W, W alloy, Ni, Ru, and Co.

In some exemplary embodiments of the present disclosure, an insulating film may be interposed between the first semiconductor substrate 110 and the first penetration via 140. The insulating film may include, but the present inventive concept is not necessarily limited to including, an oxide film, a nitride film, a carbide film, a polymer or a combination thereof.

The first semiconductor chip 200 may be stacked on the base substrate 100. The first semiconductor chip 200 may include a semiconductor element. For example, the first semiconductor chip 200 may include a second semiconductor substrate 210 and a first semiconductor element layer 220.

The second semiconductor substrate 210 may be, for example, bulk silicon or SOI. Alternatively, the first semiconductor substrate 110 may be a silicon substrate, or may include, but the present inventive concept is not necessarily limited to including, other materials such as silicon germanium, SGOI, indium antimonide, lead tellurium compound, indium arsenide, indium phosphide, gallium arsenic and/or gallium antimonide.

The first semiconductor element layer 220 may be formed on the second semiconductor substrate 210. In some exemplary embodiments of the present disclosure, the first semiconductor element layer 220 may be formed on the surface of the second semiconductor substrate 210 facing away from the first protective layer 130. For example, the first semiconductor element layer 220 may be interposed between the first protective layer 130 and the second semiconductor substrate 210.

The first semiconductor element layer 220 may include various types of plurality of individual elements and interlayer insulating films. The above-mentioned individual elements may include various microelectronic element, for example, a MOSFET (metal-oxide-semiconductor field effect transistor) such as a CMOS transistor (complementary metal-insulator-semiconductor transistor), a system LSI (large scale integration), a flash memory, a DRAM (Dynamic Random Access Memory), a SRAM (Static Random Access Memory), an EEPROM (Electrically Erasable Programmable Read-Only Memory), a PRAM (Phase Change Random Access Memory), a MRAM (Magnetic Random Access Memory), a RRAM (Resistive Random Access Memory), an image sensor such as a CIS (CMOS imaging sensor), a MEMS (micro-electro-mechanical system), an active element, a passive elements, etc.

The individual elements of the first semiconductor element layer 220 may be electrically connected to a conductive region formed in the first semiconductor substrate 110. The first semiconductor element layer 220 may include a conductive wiring or a conductor that electrically connects at least two of the plurality of individual elements or the plurality of individual elements and the conductive region of the first semiconductor substrate 110. Further, the individual elements may be electrically separated from other adjacent individual elements by the insulating films.

The first bump 410 may be interposed between the base substrate 100 and the first semiconductor chip 200. The first bump 410 may electrically connect the base substrate 100 and the first semiconductor chip 200. For example, the first bump 410 is interposed between the first protective layer 130 and the first semiconductor element layer 220, and may be connected to the first penetration via 140 and the first semiconductor element layer 220.

In some exemplary embodiments of the present disclosure, a plurality of first connection pads 190 may be formed on the first protective layer 130. The first connection pads 190 may be formed on the top side of the first protective layer 130 and may be connected to the top side of the first penetration via 140. The first bump 410 may be formed on the first connection pad 190. Accordingly, the first bump 410 may be electrically connected to the first penetration via 140. In some exemplary embodiments of the present disclosure, the width of the first connection pad 190 may be greater than the width of the first penetration via 140.

In some exemplary embodiments of the present disclosure, a plurality of second connection pads 290 may be formed on the first semiconductor chip 200. The second connection pad 290 is formed on the bottom side of the first semiconductor chip 200 and may be connected to the first bump 410. Therefore, the first bump 410 may be electrically connected to the first semiconductor chip 200.

The first fillet layer 420 may be interposed between the base substrate 100 and the first semiconductor chip 200. Also, the first fillet layer 420 may at least partially surround the first bump 410, the first connection pad 190, and the second connection pad 290. The first fillet layer 420 may be an underfill layer that fills a space between the base substrate 100 and the first semiconductor chip 200.

The first fillet layer 420 may include, but the present inventive concept is not necessarily limited to including, for example, an epoxy resin. In some exemplary embodiments of the present disclosure, the first fillet layer 420 may include a filler. The filler may include, for example, silica. For example, the filler may have a particle size of 0.1 μm to several μm or less, and may have an average particle size of about 0.3 μm to 1 μm. In some exemplary embodiments of the present disclosure, the first fillet layer 420 may include filler of about 55 wt % to 75 wt % with respect to 100 wt % of the first fillet layer 420.

The first fillet layer 420 may be formed by, but the present inventive concept is not necessarily limited to, for example, a capillary underfill process.

A part of the first fillet layer 420 may fill the side trenches T11 to T14. For example, as shown in FIG. 2, a lower part of the first fillet layer 420 may fill the first side trench T11 and the third side trench T13.

The molding member 600 may be formed on the base substrate 100. The molding member 600 may at least partially cover the first fillet layer 420 and the first semiconductor chip 200. The molding member 600 may include, for example, a polymer such as a resin. For example, the molding member 600 may include, but the present inventive concept is not necessarily limited to including, an EMC (Epoxy Molding Compound).

Hereinafter, the effects of the semiconductor package according to some exemplary embodiments of the present disclosure will be described with reference to FIGS. 1 to 3.

Figure 3:
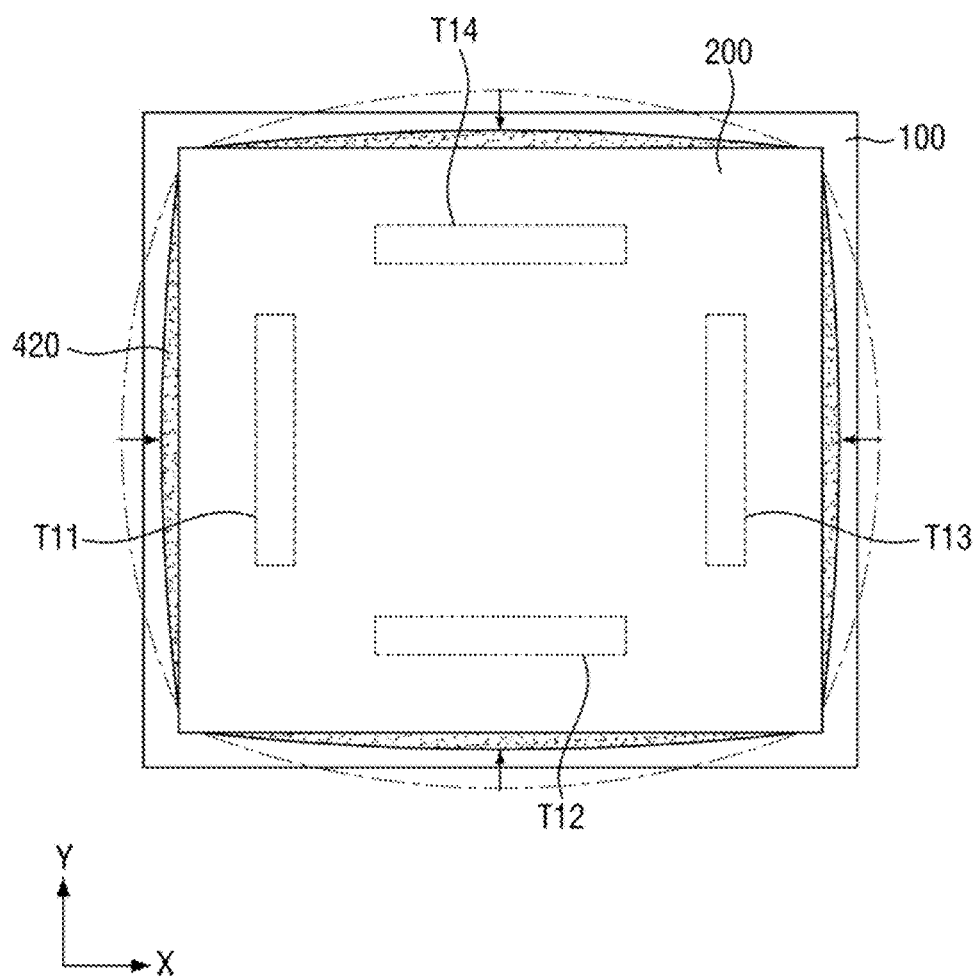
FIG. 3 is a layout diagram illustrating a fillet layer of the semiconductor package of FIG. 1.

FIG. 3 is a layout diagram illustrating a fillet layer of the semiconductor package of FIG. 1. For convenience of explanation, repeated parts of contents explained using FIGS. 1 and 2 will be briefly described or omitted. To the extent that a description of an element has been omitted, it may be assumed that the omitted element is at least partially similar to corresponding elements that are described in detail elsewhere within the present disclosure.

Referring to FIG. 3, the semiconductor package, according to some exemplary embodiments of the present disclosure, can increase the product reliability, by reducing an amount of the first fillet layer 420 protruding from the side surface (side) of the first semiconductor chip 200.

For example, the first fillet layer 420 may be formed to fill a space between the base substrate 100 and the first semiconductor chip 200, using a capillary underfill process. In this process, the first fillet layer 420 may spread radially from the center CP of the base substrate 100. Since the corner of the first semiconductor chip 200 is spaced apart from the center CP of the base substrate 100 further than the side surface (side) of the first semiconductor chip 200, the amount of the first fillet layer 420 protruding from the outer peripheral surface of the first semiconductor chip 200 may increase as it goes away from the corner of the first semiconductor chip 200. As a result, the first fillet layer 420 that protrudes excessively from the side surface (side) of the first semiconductor chip 200 may be exposed from the molding member 600 and cause defects such as cracks, which causes degradation in the product reliability of the semiconductor package.

However, the semiconductor package, according to some exemplary embodiments of the present disclosure, can reduce the amount of the first fillet layer 420 protruding from the side surface (side) of the first semiconductor chip 200 using the side trenches T11 to T14. For example, the side trenches T11 to T14 may be formed in the first protective layer (130 of FIG. 2) in the side regions (ER11 to ER14 of FIG. 1). As a result, since the amount of the first fillet layer 420 spreading from the center CP of the base substrate 100 toward the side surface (side) of the first semiconductor chip 200 decreases, a semiconductor package with increased product reliability may be provided.

Also, in some exemplary embodiments of the present disclosure, the first protective layer 130 in the corner regions (CR1 to CR4 of FIG. 1) might not include a trench. In such a case, the amount of the first fillet layer 420 spreading from the center CP of the base substrate 100 toward the corner of the first semiconductor chip 200 may be maintained. As a result, the first fillet layer 420, which more densely fills the space between the base substrate 100 and the first semiconductor chip 200, may be formed.

Figure 4:
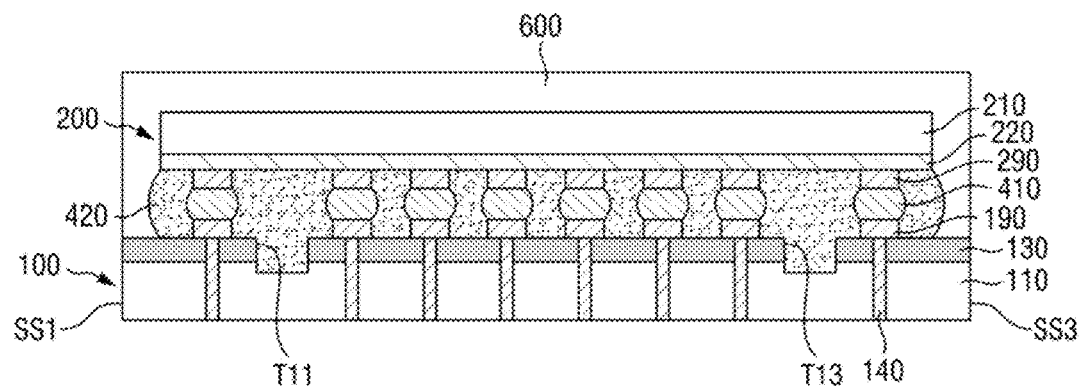
FIG. 4 is a cross-sectional view illustrating a semiconductor package according to some exemplary embodiments of the present disclosure.

FIG. 4 is a cross-sectional view illustrating a semiconductor package according to some exemplary embodiments of the present disclosure. For convenience of explanation, repeated parts of contents explained using FIGS. 1 to 3 will be simply described or omitted. To the extent that a description of an element has been omitted, it may be assumed that the omitted element is at least partially similar to corresponding elements that are described in detail elsewhere within the present disclosure.

Referring to FIG. 4, in the semiconductor package, according to some exemplary embodiments of the present disclosure, the depths of the side trenches T11 to T14 are greater than or equal to the thickness of the first protective layer 130.

For example, as shown, the depth of the first side trench T11 and the depth of the third side trench T13 may be greater than or equal to the thickness of the first protective layer 130.

In some exemplary embodiments of the present disclosure, the height of the bottom side of the side trenches T11 to T14 may be lower or equal to the height of the top side of the first semiconductor substrate 110. For example, as shown, the bottom side of the first side trench T11 and the bottom side of the third side trench T13 may expose a part of the first semiconductor substrate 110.

Figure 5:
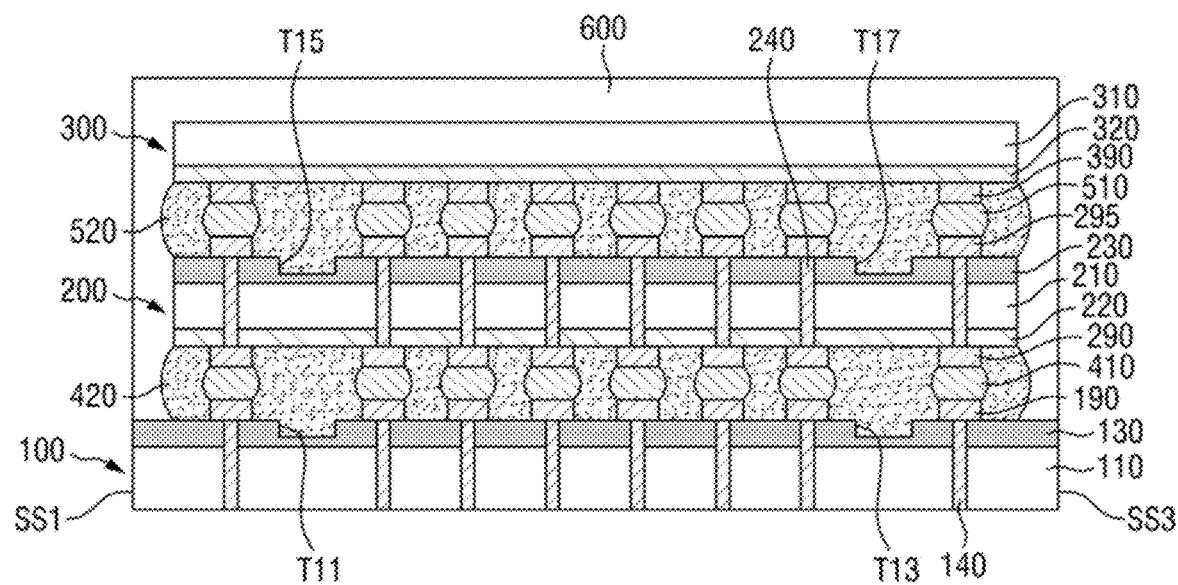
FIG. 5 is a cross-sectional view illustrating a semiconductor package according to some exemplary embodiments of the present disclosure.

FIG. 5 is a cross-sectional view illustrating a semiconductor package according to some exemplary embodiments of the present disclosure. For convenience of explanation, repeated parts of contents explained using FIGS. 1 to 3 will be simply described or omitted. To the extent that a description of an element has been omitted, it may be assumed that the omitted element is at least partially similar to corresponding elements that are described in detail elsewhere within the present disclosure.

Referring to FIG. 5, the semiconductor package, according to some exemplary embodiments of the present disclosure, further includes a second semiconductor chip 300, a second bump 510, and a second fillet layer 520.

The second semiconductor chip 300 may be stacked on the first semiconductor chip 200. The second semiconductor chip 300 may include a semiconductor element. For example, the second semiconductor chip 300 may include a third semiconductor substrate 310 and a second semiconductor element layer 320.

The third semiconductor substrate 310 may be, for example, bulk silicon or SOI. Alternatively, the first semiconductor substrate 110 may be a silicon substrate, or may include, but the present inventive concept is not necessarily limited to including, other materials such as silicon germanium, SGOI, indium antimonide, lead tellurium compound, indium arsenide, indium phosphide, gallium arsenic or gallium antimonide.

The second semiconductor element layer 320 may be formed on the third semiconductor substrate 310. In some exemplary embodiments of the present disclosure, the second semiconductor element layer 320 may be formed on the surface of the third semiconductor substrate 310 facing away from a second protective layer 230, which is described in greater detail below. For example, the second semiconductor element layer 320 may be interposed between the second protective layer 230 and the third semiconductor substrate 310.

Similarly to the first semiconductor element layer 220, the second semiconductor element layer 320 may include various types of plurality of individual elements and interlayer insulating films.

In some exemplary embodiments of the present disclosure, the first semiconductor chip 200 may further include a second protective layer 230. The second protective layer 230 may at least partially cover the top side of the second semiconductor substrate 210. In some exemplary embodiments of the present disclosure, the second protective layer 230 may at least partially cover the back side of the second semiconductor substrate 210. For example, the first semiconductor element layer 220 may be formed on the front side of the second semiconductor substrate 210, and the second protective layer 230 may be formed on the back side of the second semiconductor substrate 210. The second protective layer 230 may include a non-conductive film (NCF).

In some exemplary embodiments of the present disclosure, the second protective layer 230 may include a fifth side trench T15 and a sixth side trench T17. For example, the fifth side trench T15 and the sixth side trench T17 may be formed by etching a part of the second protective layer 230.

Similarly to the first to fourth side trenches T11 to T14, the fifth and sixth side trenches T15 and T17 may be formed in the side region of the first semiconductor chip 200. In some exemplary embodiments of the present disclosure, the fifth and sixth side trenches T15 and T17 may at least partially overlap the second semiconductor chip 300. Since the arrangement of the fifth and sixth side trenches T15 and T17 is similar to the explanation of the first and third side trenches T11 and T13, detailed description thereof will not be provided below. To the extent that a description of an element has been omitted, it may be assumed that the omitted element is at least partially similar to corresponding elements that are described in detail elsewhere within the present disclosure.

In some exemplary embodiments of the present disclosure, the first semiconductor chip 200 may further include a plurality of second penetration vias 240 that penetrates the second semiconductor substrate 210. The second penetration via 240 may have a columnar shape.

In some exemplary embodiments of the present disclosure, the second penetration via 240 may penetrate the second semiconductor substrate 210 and the second protective layer 230. For example, the bottom side of the second penetration via 240 may be exposed from the bottom side of the second semiconductor substrate 210, and the top side of the second penetration via 240 may be exposed from the top side of the second protective layer 230.

In some exemplary embodiments of the present disclosure, the second penetration via 240 might not overlap the fifth and sixth side trenches T15 and T17. For example, the top side of the first penetration via 140 might not be exposed from the fifth and sixth side trenches T15 and T17.

The second bump 510 may be interposed between the first semiconductor chip 200 and the second semiconductor chip 300. The second bump 510 may electrically connect the first semiconductor chip 200 and the second semiconductor chip 300. For example, the second bump 510 is interposed between the second protective layer 230 and the second semiconductor element layer 320, and may be connected to the second penetration via 240 and the second semiconductor element layer 320.

In some exemplary embodiments of the present disclosure, a plurality of third connection pads 295 may be formed on the second protective layer 230. The third connection pad 295 is formed on the top side of the second protective layer 230, and may be connected to the top side of the second penetration via 240. The second bump 510 may be formed on the third connection pad 295. Accordingly, the second bump 510 may be electrically connected to the second penetration via 240. In some exemplary embodiments of the present disclosure, the width of the third connection pad 295 may be greater than the width of the second penetration via 240.

In some exemplary embodiments of the present disclosure, a plurality of fourth connection pads 390 may be formed on the second semiconductor chip 300. The fourth connection pad 390 is formed on the bottom side of the second semiconductor chip 300, and may be connected to the second bump 510. Therefore, the second bump 510 may be electrically connected to the second semiconductor chip 300.

The second fillet layer 520 may be interposed between the first semiconductor chip 200 and the second semiconductor chip 300. Also, the second fillet layer 520 may at least partially surround the second bump 510, the third connection pad 295, and the fourth connection pad 390. The second fillet layer 520 may be an underfill layer that fills a space between the first semiconductor chip 200 and the second semiconductor chip 300.

The second fillet layer 520 may include, but the present inventive concept is not necessarily limited to including, for example, an epoxy resin. The second fillet layer 520 may be formed by, but the present inventive concept is not necessarily limited to, for example, a capillary underfill process.

A part of the second fillet layer 520 may fill the fifth and sixth side trenches T15 and T17. For example, the lower part of the second fillet layer 520 may fill the fifth and sixth side trenches T15 and T17. Therefore, the semiconductor package, according to some exemplary embodiments of the present disclosure, can increase the product reliability, by reducing the amount of the second fillet layer 520 protruding from the side surface (side) of the first semiconductor chip 200 and/or the side surface (side) of the second semiconductor chip 300.

In some exemplary embodiments of the present disclosure, the molding member 600 may at least partially cover the first fillet layer 420, the first semiconductor chip 200, the second fillet layer 520, and the second semiconductor chip 300.

Figure 6:
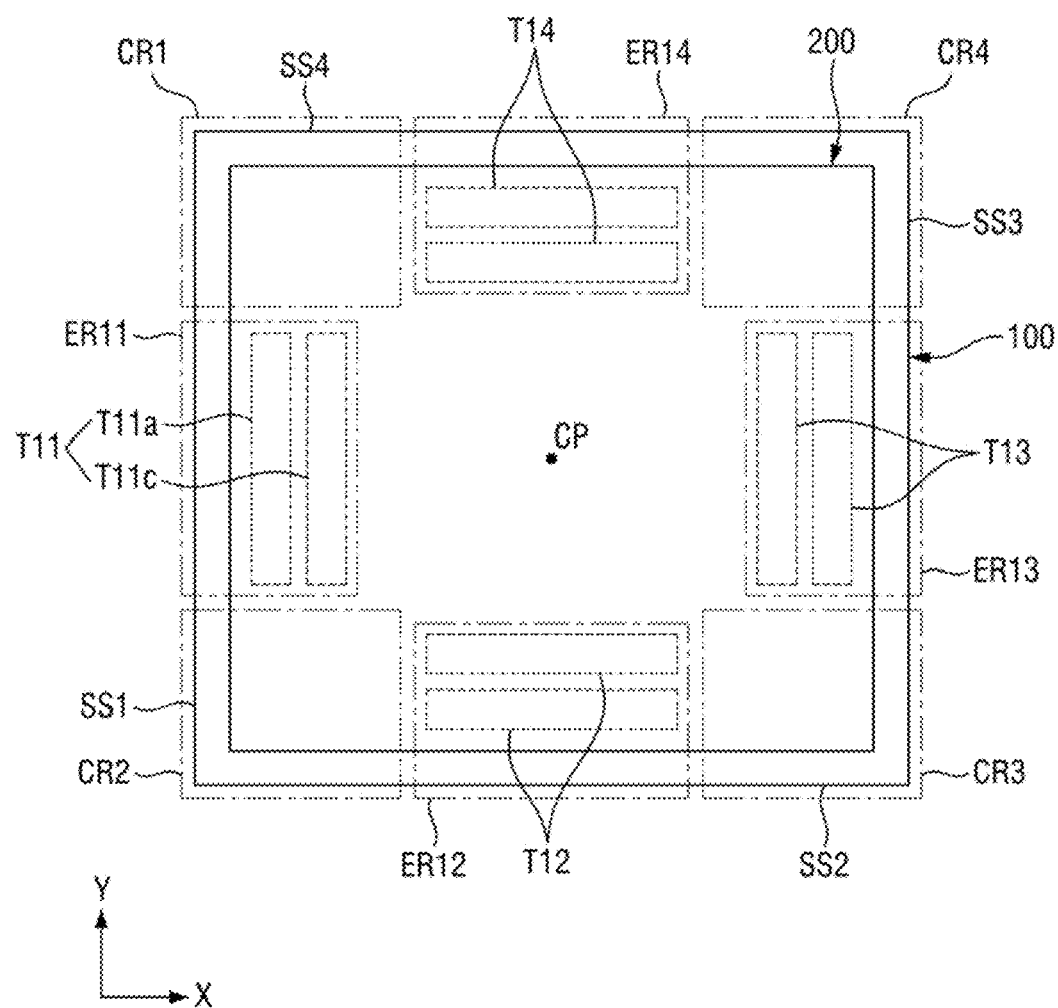
FIG. 6 is a layout diagram illustrating a semiconductor package according to some exemplary embodiments of the present disclosure.

FIG. 6 is a layout diagram illustrating a semiconductor package according to some exemplary embodiments of the present disclosure. For convenience of explanation, repeated parts of contents explained using FIGS. 1 to 3 will be simply described or omitted. To the extent that a description of an element has been omitted, it may be assumed that the omitted element is at least partially similar to corresponding elements that are described in detail elsewhere within the present disclosure.

Referring to FIG. 6, in the semiconductor package, according to some exemplary embodiments of the present disclosure, each of the side trenches T11 to T14 includes a plurality of sub-side trenches.

For example, the first side trench T11 may include a first sub-side trench T11a and a second sub-side trench T11b. The first sub-side trench T11a and the second sub-side trench T11b may be spaced apart from each other in the first side region ER11.

In some exemplary embodiments of the present disclosure, the first sub-side trench T11a and the second sub-side trench T11b may each extend primarily in the first direction Y.

In some exemplary embodiments of the present disclosure, the first sub-side trench T11a and the second sub-side trench T11b may be arranged along the second direction X. For example, the first sub-side trench T11a may be closer to the first side surface SS1 than the second sub-side trench T11b. Further, for example, the second sub-side trench T11b may be closer to the first side surface SS1 than the first sub-side trench T11a.

Although the first sub-side trench T11a and the second sub-side trench T11b are shown as having the same size, this is only an example. For example, the first sub-side trench T11a and the second sub-side trench T11b may have lengths, widths or depths different from each other. Accordingly, the first sub-side trench T11a and the second sub-side trench T11b may have volumes different from each other.

Figure 7:
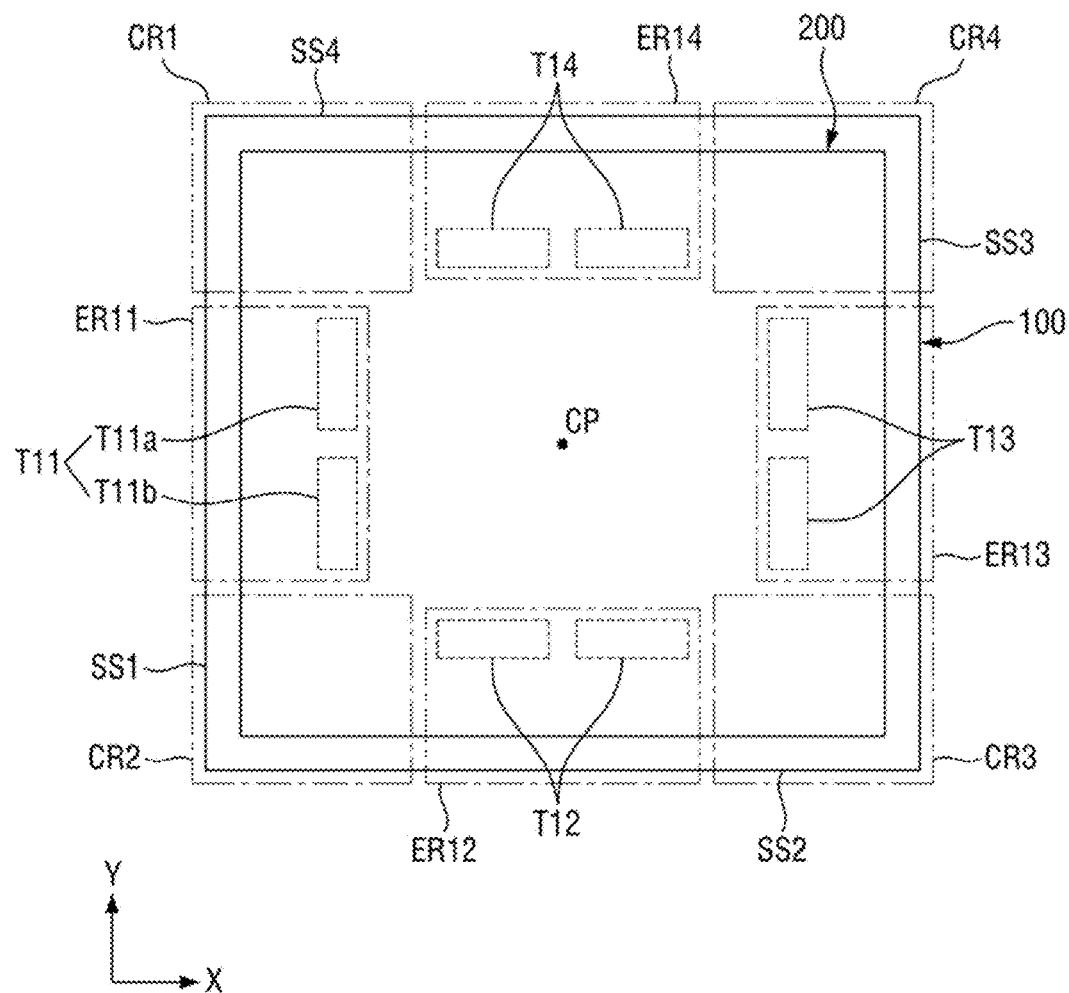
FIG. 7 is a layout diagram illustrating a semiconductor package according to some exemplary embodiments of the present disclosure.

FIG. 7 is a layout diagram illustrating a semiconductor package according to some exemplary embodiments of the present disclosure. For convenience of explanation, repeated parts of contents explained using FIGS. 1, 2, and 6 will be briefly described or omitted. To the extent that a description of an element has been omitted, it may be assumed that the omitted element is at least partially similar to corresponding elements that are described in detail elsewhere within the present disclosure.

Referring to FIG. 7, in the semiconductor package, according to some exemplary embodiments of the present disclosure, the first sub-side trench T11a and the second sub-side trench T11b are arranged along the first direction Y.

For example, the first sub-side trench T11a may be closer to the first corner region CR1 than the second sub-side trench T11b. Further, for example, the second sub-side trench T11b may be closer to the second corner region CR2 than the first sub-side trench T11a.

Figure 8:
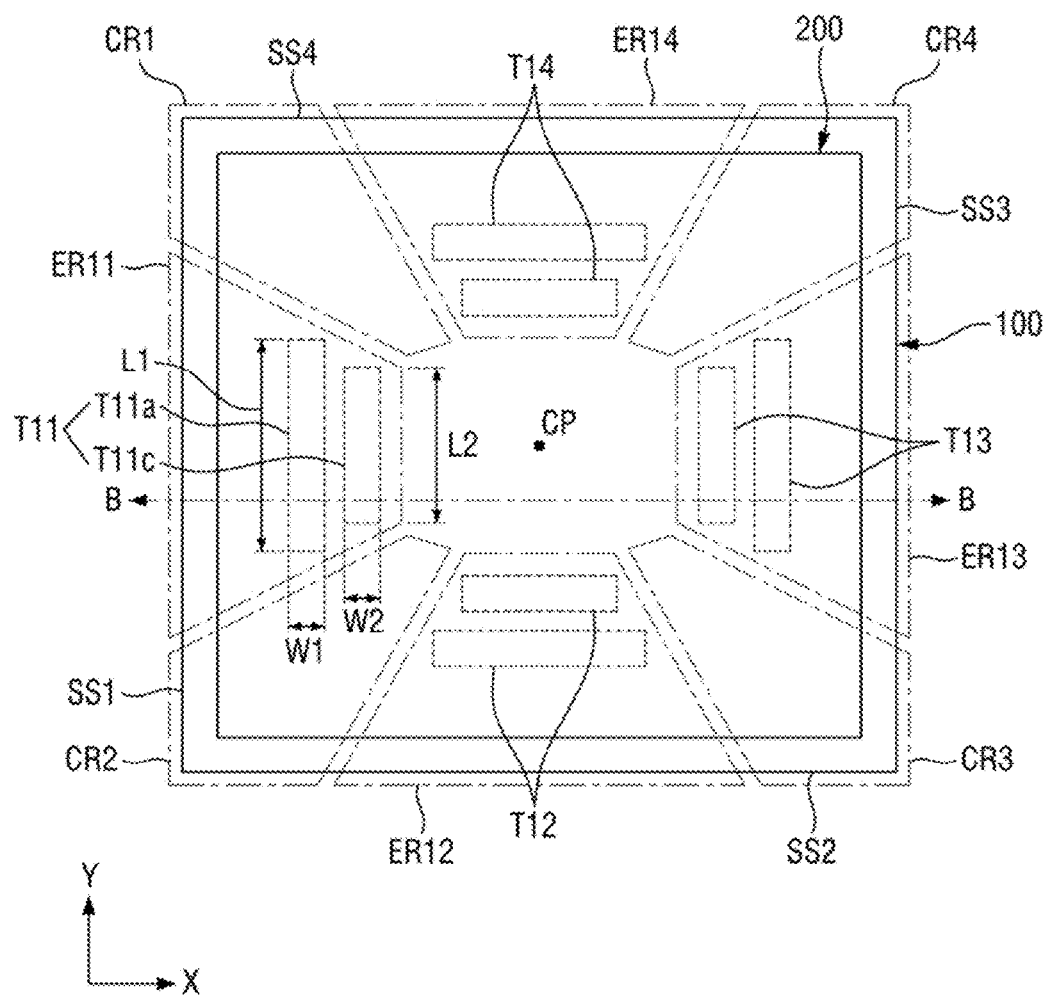
FIG. 8 is a layout diagram illustrating a semiconductor package according to some exemplary embodiments of the present disclosure
Figure 9:
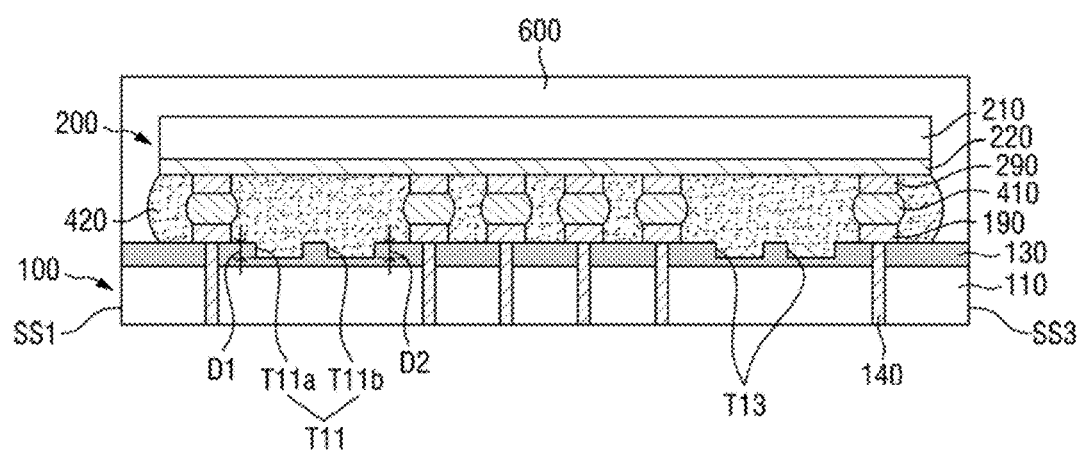
FIG. 9 is a cross-sectional view taken along a line B-B of FIG. 8.

FIG. 8 is a layout diagram illustrating a semiconductor package according to some exemplary embodiments of the present disclosure. FIG. 9 is a cross-sectional view taken along a line B-B of FIG. 8. For convenience of explanation, repeated parts of contents explained using FIGS. 1, 2, and 6 will be briefly described or omitted. To the extent that a description of an element has been omitted, it may be assumed that the omitted element is at least partially similar to corresponding elements that are described in detail elsewhere within the present disclosure.

Referring to FIGS. 8 and 9, in the semiconductor package, according to some exemplary embodiments of the present disclosure, the length of the side trenches T11 to T14 increases as it goes away from the center CP of the base substrate 100.

For example, a length L1 of the first sub-side trench T11a may be greater than a length L2 of the second sub-side trench T11b. Here, the length means a length of a long side in an object including a short side and the long side longer than the short side. For example, as shown, the first sub-side trench T11a and the second sub-side trench T11b may extend primarily in the first direction Y. For example, the first sub-side trench T11a and the second sub-side trench T11b may each include a long side extending in the first direction Y. At this time, the length L1 of the first sub-side trench T11a and the length L2 of the second sub-side trench T11b mean a length in the first direction Y.

Although a width W1 of the first sub-side trench T11a is shown as being only the same as the width W2 of the second sub-side trench T11b, this is merely an example. For example, the width W1 of the first sub-side trench T11a may be different from the width W2 of the second sub-side trench T11b. Here, the width means a length of the short side in the object including the short side and the long side longer than the short side. For example, the first sub-side trench T11a and the second sub-side trench T11b may each include a short side extending in the second direction X. At this time, the width W1 of the first sub-side trench T11a and the width W2 of the second sub-side trench T11b mean a length in the second direction X.

In FIG. 9, although a depth D1 of the first sub-side trench T11a is shown as only being the same as a depth D2 of the second sub-side trench T11b, this is only an example. For example, the depth D1 of the first sub-side trench T11a may be different from the depth D2 of the second sub-side trench T11b.

Figure 10:
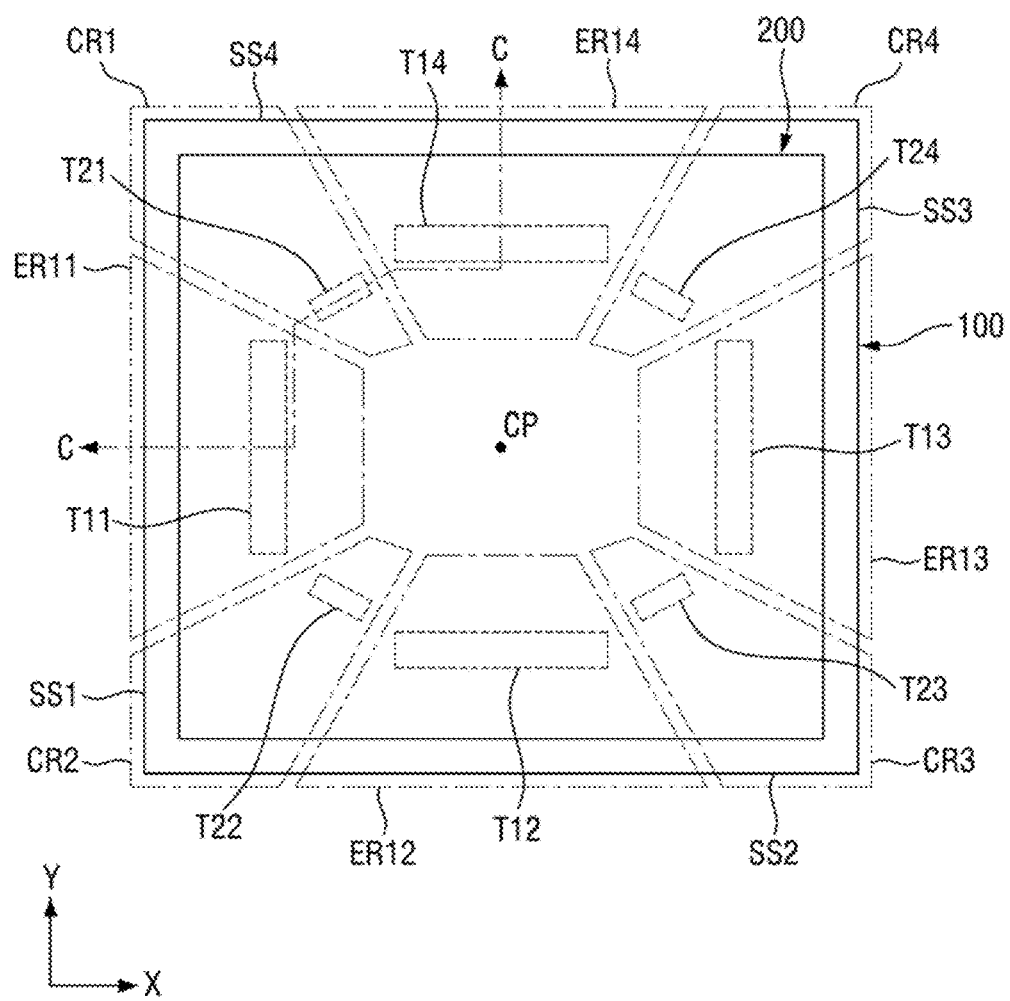
FIG. 10 is a layout diagram illustrating the semiconductor package according to some exemplary embodiments of the present disclosure.
Figure 11:
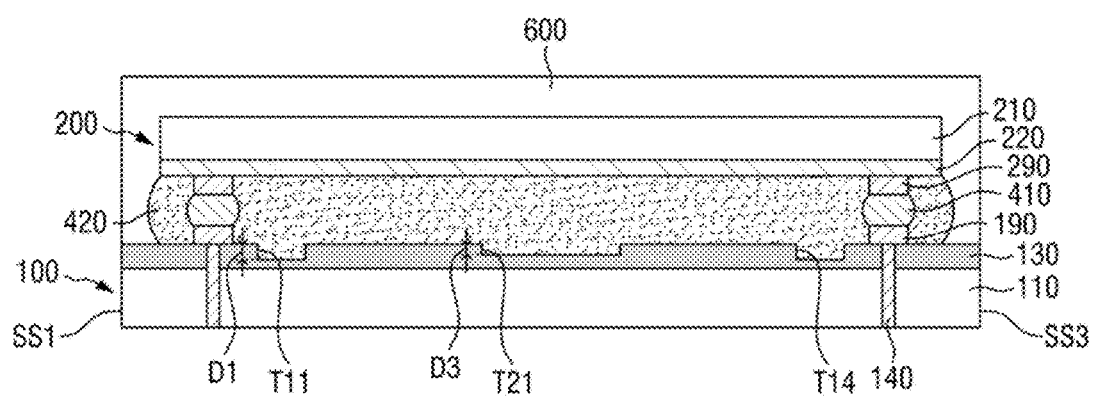
FIG. 11 is a cross-sectional view taken along a line C-C of FIG. 10.
Figure 12:
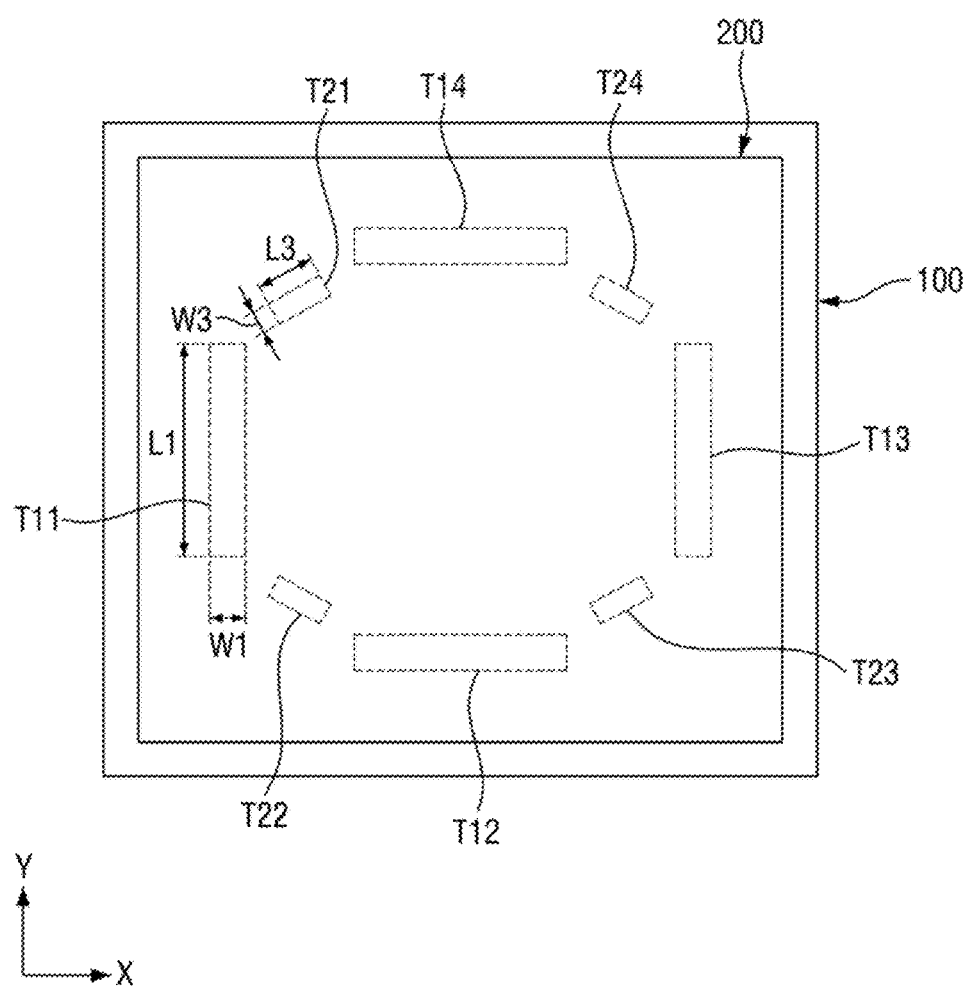
FIG. 12 is a layout diagram illustrating a side trench and a corner trench of FIG. 10.

FIG. 10 is a layout diagram illustrating the semiconductor package according to some exemplary embodiments of the present disclosure. FIG. 11 is a cross-sectional view taken along a line C-C of FIG. 10. FIG. 12 is a layout diagram illustrating a side trench and a corner trench of FIG. 10. For convenience of explanation, repeated parts of contents explained using FIGS. 1 to 9 will be briefly described or omitted. To the extent that a description of an element has been omitted, it may be assumed that the omitted element is at least partially similar to corresponding elements that are described in detail elsewhere within the present disclosure.

Referring to FIGS. 10 to 12, in the semiconductor package, according to some exemplary embodiments of the present disclosure, the first protective layer 130 includes corner trenches T21 to T24.

The corner trenches T21 to T24 may be formed, for example, by etching a part of the first protective layer 130.

The corner trenches T21 to T24 may be formed in the corner regions CR1 to CR4. For example, as shown in FIG. 10, a first corner trench T21 may be formed in the first corner region CR1, a second corner trench T22 may be formed in the second corner region T22, a third corner trench T23 may be formed in the third corner region CR3, and a fourth corner trench T24 may be formed in the fourth corner region CR4.

In some exemplary embodiments of the present disclosure, the corner trenches T21 to T24 may at least partially overlap the first semiconductor chip 200. For example, from a planar viewpoint, the corner trenches T21 to T24 may be at least partially covered by the first semiconductor chip 200.

In some exemplary embodiments of the present disclosure, the volumes of the corner trenches T21 to T24 may be smaller than the volumes of the side trenches T11 to T14. The volumes of the trenches may be defined, for example, as the product of the length, width and depth of each trench.

For example, as shown in FIG. 12, the length L1 of the first side trench T11 may be greater than the length L3 of the first corner trench T21. Alternatively, for example, the width W1 of the first side trench T11 may be greater than the width W3 of the first corner trench T21. Alternatively, for example, as shown in FIG. 11, the depth D1 of the first side trench T1 may be greater than the depth D3 of the first corner trench T21.

The amount of the first fillet layer 420 protruding from the side surface (side) of the first semiconductor chip 200 may be controlled by the volumes of the side trenches T11 to 14 formed in the side regions ER11 to ER14 and the volumes of the corner trenches T21 to T24 formed in the corner regions CR1 to CR4.

Figure 13:
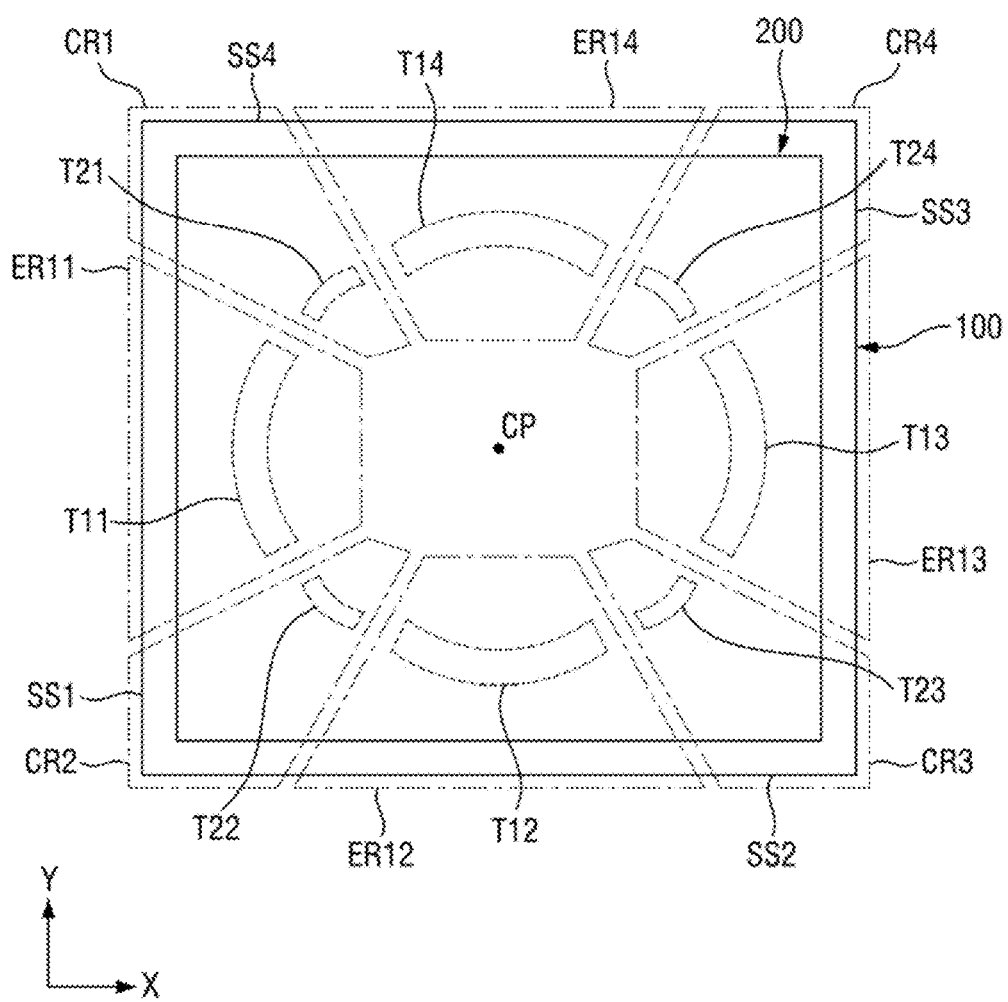
FIG. 13 is a layout diagram illustrating a semiconductor package according to some exemplary embodiments of the present disclosure.

FIG. 13 is a layout diagram illustrating a semiconductor package according to some exemplary embodiments of the present disclosure. For convenience of explanation, repeated parts of contents explained using FIGS. 1 to 12 will be briefly described or omitted. To the extent that a description of an element has been omitted, it may be assumed that the omitted element is at least partially similar to corresponding elements that are described in detail elsewhere within the present disclosure.

Referring to FIG. 13, in the semiconductor package, according to some exemplary embodiments of the present disclosure, the side trenches T11 to T14 have a curved shape from a planar viewpoint.

In some exemplary embodiments of the present disclosure, the side trenches T11 to T14 may each form a concave surface facing away from the center CP of the base substrate 100. For example, as shown, the first side trench T11 may form a concave surface toward the right, the second side trench T12 may form a concave surface toward the top, the side trench T13 may form a concave surface toward the left, and the fourth side trench T14 may form a concave surface toward the bottom.

In some exemplary embodiments of the present disclosure, similarly to the side trenches T11 to T14, the corner trenches T21 to T24 may each have a concave surface facing away from the center CP of the base substrate 100.

Figure 14:
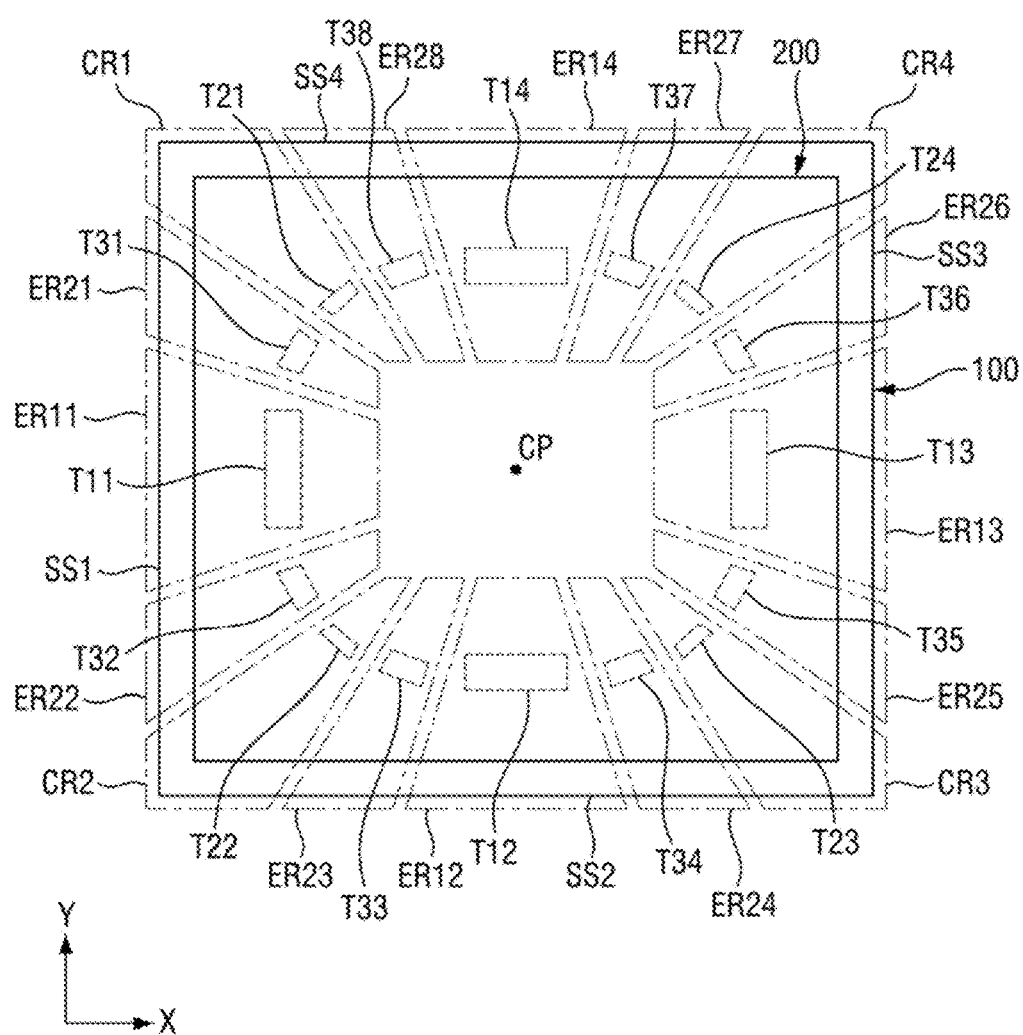
FIG. 14 is a layout diagram illustrating a semiconductor package according to some exemplary embodiments of the present disclosure.

FIG. 14 is a layout diagram illustrating a semiconductor package according to some exemplary embodiments of the present disclosure. For convenience of explanation, repeated parts of contents explained using FIGS. 1 to 12 will be briefly described or omitted. To the extent that a description of an element has been omitted, it may be assumed that the omitted element is at least partially similar to corresponding elements that are described in detail elsewhere within the present disclosure.

Referring to FIG. 14, in the semiconductor package, according to some exemplary embodiments of the present disclosure, the base substrate 100 further includes fifth to twelfth side regions ER21 to ER28.

A fifth side region ER21 may be interposed between the first corner region CR1 and the first side region ER11. A sixth side region ER22 may be interposed between the second corner region CR2 and the first side region ER11. A seventh side region ER23 may be interposed between the second corner region CR2 and the second side region ER12. An eighth side region ER24 may be interposed between the third corner region CR3 and the second side region ER12. A ninth side region ER25 may be interposed between the third corner region CR3 and the third side region ER13. A tenth side region ER26 may be interposed between the fourth corner region CR4 and the third side region ER13. An eleventh side region ER27 may be interposed between the fourth corner region CR4 and the fourth side region ER14. A twelfth side region ER28 may be interposed between the first corner region CR1 and the fourth side region ER14.

In some exemplary embodiments of the present disclosure, the distance from the center CP of the base substrate 100 to the side surface of the base substrate 100 in the fifth to twelfth side regions ER21 to ER28 may be greater than the distance to the side surface of the base substrate 100 in the first to fourth side regions ER11 to ER14. Also, in some exemplary embodiments of the present disclosure, the distance from the center CP of the base substrate 100 to the side surface of the base substrate 100 in the fifth to twelfth side regions ER21 to ER28 may be smaller than the distance from the center CP of the base substrate 100 to the side surface of the base substrate 100 in the corner regions CR1 to CR4.

In some exemplary embodiments of the present disclosure, seventh to fourteenth side trenches T31 to T38 may be formed in the fifth to twelfth side regions ER21 to ER28. For example, as shown, each of the seventh to fourteenth side trenches T31 to T38 may be formed in the fifth to twelfth side regions ER21 to ER28.

In some exemplary embodiments of the present disclosure, the seventh to fourteenth side trenches T31 to T38 may at least partially overlap the first semiconductor chip 200.

In some exemplary embodiments of the present disclosure, the volume of each of the seventh to fourteenth side trenches T31 to T38 may be smaller than the volume of each of the first to fourth side trenches T11 to T14. In some exemplary embodiments of the present disclosure, the volume of each of the seventh to fourteenth side trenches T31 to T38 may be greater than the volume of the first to fourth corner trenches T21 to T24. The volume of the trenches may be defined, for example, as the product of the length, width and depth of each trench. The amount of the first fillet layer 420 protruding from the side surface (side) of the first semiconductor chip 200 may be controlled accordingly.

Those skilled in the art will appreciate that many variations and modifications may be made to the exemplary embodiments of the present disclosure described herein without substantially departing from the principles of the present disclosure.

What is claimed is:

1. A semiconductor package, comprising:
a base substrate including a first semiconductor substrate and a first protective layer at least partially covering a top side of the first semiconductor substrate;
a first semiconductor chip disposed on the first protective layer;
a first fillet layer at least partially filling a space between the first protective layer and the first semiconductor chip; and
a molding contacting the base substrate and covering both the first semiconductor chip and the fillet layer,
wherein the base substrate further includes a first side surface extending primarily in a first direction, and a second side surface and a third side surface each extending from ends of the first side surface primarily in a second direction intersecting the first direction,
wherein the base substrate further includes a first corner region including a first corner formed by the first side surface and the second side surface, a second corner region formed by the first side surface and the third side surface, and a side region between the first corner region and the second corner region,
wherein the first protective layer in the side region includes a first side trench extending partially through a thickness of the first protective layer and at least partially overlapping the first semiconductor chip such that a bottom surface of the first protective layer and a too surface of the first semiconductor substrate are planar, and
wherein a first part of the first fillet layer at least partially fills the first side trench.

2. The semiconductor package of claim 1, wherein the first semiconductor chip includes a second semiconductor substrate, and a semiconductor element layer disposed between the second semiconductor substrate and the first fillet layer.

3. The semiconductor package of claim 1, further comprising:
a second semiconductor chip disposed on the first semiconductor chip; and
a second fillet layer at least partially filling a space between the first semiconductor chip and the second semiconductor chip.

4. The semiconductor package of claim 3, wherein the first semiconductor chip includes a second semiconductor substrate, and a second protective layer at least partially covering a top side of the second semiconductor substrate,
wherein the second protective layer includes a second side trench at least partially overlapping the second semiconductor chip, and
wherein a part of the second fillet layer at least partially fills the second side trench.

5. The semiconductor package of claim 1, wherein the first side trench extends primarily in the first direction.

6. The semiconductor package of claim 1, wherein the first protective layer in the first corner region and the second corner region omits a trench.

7. The semiconductor package of claim 1, wherein the first side trench includes a first sub-side trench and a second sub-side trench, spaced apart from each other in the side region.

8. The semiconductor package of claim 7, wherein the first sub-side trench is closer to the first side surface than it is to the second sub-side trench.

9. The semiconductor package of claim 8, wherein a length of the first sub-side trench in the first direction is longer than a length of the second sub-side trench in the first direction.

10. The semiconductor package of claim 1, wherein the first side trench forms a concave surface facing away from a center of the base substrate.

11. A semiconductor package, comprising:
a base substrate including a semiconductor substrate, and a protective layer at least partially covering a top side of the semiconductor substrate;
a semiconductor chip disposed on the protective layer;
a fillet layer at least partially filling a space between the protective layer and the semiconductor chip; and
a molding contacting the base substrate and covering both the semiconductor chip and the fillet layer,
wherein the base substrate includes a first side surface extending primarily in a first direction, and a second side surface extending from one end of the first side surface primarily in a second direction intersecting the first direction,
wherein the base substrate further includes a first corner region including a corner formed by the first side surface and the second side surface, and a first side region spaced apart from the corner and including a part of the first side surface,
wherein the protective layer in the first side region includes a first side trench extending partially through a thickness of the protective layer and at least partially overlapping the semiconductor chip such that a bottom surface of the protective layer and a top surface of the semiconductor substrate are planar,
wherein the protective layer in the first corner region includes a corner trench at least partially overlapping the semiconductor chip,
wherein a volume of the first side trench is greater than a volume of the corner trench, and
wherein a part of the fillet layer at least partially fills the first side trench and the corner trench.

12. The semiconductor package of claim 11, wherein a distance from a center of the base substrate to the first side surface in the first side region is greater than a distance from the center of the base substrate to the first side surface in the first corner region.

13. The semiconductor package of claim 11, wherein a depth of the first side trench is greater than a depth of the corner trench.

14. The semiconductor package of claim 11, wherein the base substrate further includes a second side region spaced apart from the corner and including a part of the second side surface,
wherein the protective layer in the second side region includes a second side trench at least partially overlapping the semiconductor chip, and
wherein a volume of the second side trench is greater than a volume of the corner trench.

15. The semiconductor package of claim 11, wherein the base substrate further includes a second side region disposed between the first corner region and the first side region,
wherein the protective layer in the second side region includes a second side trench at least partially overlapping the semiconductor chip, and wherein the volume of the second side trench is smaller than the volume of the first side trench and is greater than the volume of the corner trench.

16. A semiconductor package, comprising:
a base substrate including a first semiconductor substrate, a first protective layer at least partially covering a top side of the first semiconductor substrate, and a first penetration via penetrating both the first semiconductor substrate and the first protective layer;
a first semiconductor chip disposed on the first protective layer;
a first bump electrically connecting the first penetration via and the first semiconductor chip;
a first fillet layer at least partially surrounding the first bump, between the first protective layer and the first semiconductor chip; and
a molding contacting the base substrate and covering both the first semiconductor chip and the first fillet layer,
wherein the base substrate further includes a first side surface extending primarily in a first direction, and a second side surface extending from one end of the first side surface primarily in a second direction intersecting the first direction,
wherein the base substrate further includes a corner region including a corner formed by the first side surface and the second side surface, and a side region spaced apart from the corner and including a part of the first side surface,
wherein the first protective layer in the side region includes a first side trench extending partially through a thickness of the first protective layer and at least partially overlapping the first semiconductor chip such that a bottom surface of the first protective layer and a top surface of the first semiconductor substrate are planar, and
wherein a part of the first fillet layer at least partially fills the first side trench.

17. The semiconductor package of claim 16, further comprising:
a first connection pad connected to the first penetration via, on a top side of the first protective layer, and
a second connection pad disposed on a bottom side of the first semiconductor chip,
wherein the first bump connects the first connection pad to the second connection pad.

18. The semiconductor package of claim 17, wherein the first semiconductor chip includes a second semiconductor substrate, and a semiconductor element layer disposed between the second semiconductor substrate and the first fillet layer, and
wherein the second connection pad connects the semiconductor element layer to the first bump.

19. The semiconductor package of claim 16, further comprising:
a second semiconductor chip on the first semiconductor chip;
a second bump connecting the first semiconductor chip to the second semiconductor chip; and
a second fillet layer at least partially surrounding the second bump, between the first semiconductor chip and the second semiconductor chip.

20. The semiconductor package of claim 19, wherein the first semiconductor chip includes a second semiconductor substrate, a second protective layer at least partially covering a top side of the second semiconductor substrate, and a second penetration via penetrating the second semiconductor substrate and the second protective layer,
wherein the second protective layer includes a second side trench at least partially overlapping the second semiconductor chip, and
wherein a part of the second fillet layer at least partially fills the second side trench.

* * * * *